(12) United States Patent
Piner et al.

(10) Patent No.: US 7,339,205 B2
(45) Date of Patent: *Mar. 4, 2008

(54) GALLIUM NITRIDE MATERIALS AND METHODS ASSOCIATED WITH THE SAME

(75) Inventors: Edwin Lanier Piner, Cary, NC (US); John C. Roberts, Hillsborough, NC (US); Pradeep Rajagopal, Raleigh, NC (US)

(73) Assignee: Nitronex Corporation, Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/879,703

(22) Filed: Jun. 28, 2004

(65) Prior Publication Data

US 2005/0285141 A1    Dec. 29, 2005

(51) Int. Cl.
*H01L 31/00* (2006.01)
(52) U.S. Cl. .................. 257/190; 257/189; 257/192; 257/18; 257/E29.193
(58) Field of Classification Search ........... 257/190, 257/E29.193, E21.125, 189, 192, 18
See application file for complete search history.

(56) References Cited

U.S. PATENT DOCUMENTS

| | | | |
|---|---|---|---|
| 4,768,038 A * | 8/1988 | Shibata .................. | 347/208 |
| 5,192,987 A | 3/1993 | Khan et al. | |
| 5,239,188 A | 8/1993 | Takeuchi et al. | |
| 5,290,393 A | 3/1994 | Nakamura | |
| 5,296,395 A | 3/1994 | Khan et al. | |
| 5,389,571 A | 2/1995 | Takeuchi et al. | |
| 5,393,993 A | 2/1995 | Edmond et al. | |
| 5,523,589 A | 6/1996 | Edmond et al. | |
| 5,633,192 A | 5/1997 | Moustakas et al. | |
| 5,679,965 A | 10/1997 | Schetzina | |

(Continued)

FOREIGN PATENT DOCUMENTS

EP    1209729 A1    5/2002

(Continued)

OTHER PUBLICATIONS

International Search Report and Written Opinion from International Application PCT/US2005/022488 dated Oct. 26, 2005.

(Continued)

*Primary Examiner*—Evan Pert
*Assistant Examiner*—Tan Tran
(74) *Attorney, Agent, or Firm*—Wolf, Greenfield & Sacks, P.C.

(57) ABSTRACT

Semiconductor materials including a gallium nitride material region and methods associated with such structures are provided. The semiconductor structures include a strain-absorbing layer formed within the structure. The strain-absorbing layer may be formed between the substrate (e.g., a silicon substrate) and an overlying layer. It may be preferable for the strain-absorbing layer to be very thin, have an amorphous structure and be formed of a silicon nitride-based material. The strain-absorbing layer may reduce the number of misfit dislocations formed in the overlying layer (e.g., a nitride-based material layer) which limits formation of other types of defects in other overlying layers (e.g., gallium nitride material region), amongst other advantages. Thus, the presence of the strain-absorbing layer may improve the quality of the gallium nitride material region which can lead to improved device performance.

29 Claims, 6 Drawing Sheets

U.S. PATENT DOCUMENTS

| | | | |
|---|---|---|---|
| 5,690,736 A * | 11/1997 | Tokunaga | 117/86 |
| 5,739,554 A | 4/1998 | Edmond et al. | |
| 5,741,724 A | 4/1998 | Ramandi et al. | |
| 5,760,426 A | 6/1998 | Marx et al. | |
| 5,786,606 A | 7/1998 | Nishio et al. | |
| 5,815,520 A | 9/1998 | Furushima | |
| 5,838,029 A | 11/1998 | Shakuda | |
| 5,838,706 A | 11/1998 | Edmond et al. | |
| 5,874,747 A | 2/1999 | Redwing et al. | |
| 5,880,485 A | 3/1999 | Marx et al. | |
| 5,929,467 A | 7/1999 | Kawai et al. | |
| 5,973,335 A * | 10/1999 | Shannon | 257/49 |
| 6,051,849 A | 4/2000 | Davis et al. | |
| 6,064,078 A | 5/2000 | Northrup et al. | |
| 6,064,082 A | 5/2000 | Kawai et al. | |
| 6,069,021 A | 5/2000 | Terashima et al. | |
| 6,100,545 A | 8/2000 | Chiyo et al. | |
| 6,120,600 A | 9/2000 | Edmond et al. | |
| 6,121,121 A | 9/2000 | Koide | |
| 6,139,628 A | 10/2000 | Yuri et al. | |
| 6,146,457 A | 11/2000 | Solomon | |
| 6,153,010 A | 11/2000 | Kiyoku et al. | |
| 6,156,581 A | 12/2000 | Vaudo et al. | |
| 6,177,688 B1 | 1/2001 | Linthicum et al. | |
| 6,180,270 B1 | 1/2001 | Cole et al. | |
| 6,201,262 B1 | 3/2001 | Edmond et al. | |
| 6,255,198 B1 | 7/2001 | Linthicum et al. | |
| 6,261,929 B1 | 7/2001 | Gehrke et al. | |
| 6,261,931 B1 | 7/2001 | Keller et al. | |
| 6,265,289 B1 | 7/2001 | Zheleva et al. | |
| 6,291,319 B1 | 9/2001 | Yu et al. | |
| 6,328,796 B1 | 12/2001 | Kub et al. | |
| 6,329,063 B2 | 12/2001 | Lo et al. | |
| 6,358,770 B2 | 3/2002 | Itoh et al. | |
| 6,380,108 B1 | 4/2002 | Linthicum et al. | |
| 6,391,748 B1 | 5/2002 | Temkin et al. | |
| 6,403,451 B1 | 6/2002 | Linthicum et al. | |
| 6,420,197 B1 | 7/2002 | Ishida et al. | |
| 6,426,512 B1 | 7/2002 | Ito et al. | |
| 6,440,823 B1 | 8/2002 | Vaudo et al. | |
| 6,441,393 B2 | 8/2002 | Goetz et al. | |
| 6,459,712 B2 | 10/2002 | Tanaka et al. | |
| 6,461,944 B2 | 10/2002 | Neudeck et al. | |
| 6,465,814 B2 | 10/2002 | Kasahara et al. | |
| 6,486,502 B1 | 11/2002 | Sheppard et al. | |
| 6,497,763 B2 | 12/2002 | Kub et al. | |
| 6,498,111 B1 | 12/2002 | Kapolnek et al. | |
| 6,521,514 B1 | 2/2003 | Gehrke et al. | |
| 6,524,932 B1 | 2/2003 | Zhang et al. | |
| 6,548,333 B2 | 4/2003 | Smith | |
| 6,583,034 B2 | 6/2003 | Ramdani et al. | |
| 6,583,454 B2 | 6/2003 | Sheppard et al. | |
| 6,586,781 B2 | 7/2003 | Wu et al. | |
| 6,610,144 B2 | 8/2003 | Mishra et al. | |
| 6,611,002 B2 | 8/2003 | Weeks et al. | |
| 6,617,060 B2 | 9/2003 | Weeks et al. | |
| 6,624,452 B2 | 9/2003 | Yu et al. | |
| 6,649,287 B2 | 11/2003 | Weeks Jr. et al. | |
| 6,656,615 B2 | 12/2003 | Dwilinski et al. | |
| 6,657,232 B2 | 12/2003 | Morkoc | |
| 6,765,240 B2 | 7/2004 | Tischler et al. | |
| 6,765,241 B2 | 7/2004 | Ohno et al. | |
| 6,777,278 B2 | 8/2004 | Smith | |
| 6,841,409 B2 | 1/2005 | Onishi | |
| 6,849,882 B2 | 2/2005 | Chavarkar et al. | |
| 2001/0042503 A1 | 11/2001 | Lo et al. | |
| 2002/0020341 A1 | 2/2002 | Marchand et al. | |
| 2002/0074552 A1* | 6/2002 | Weeks et al. | 257/76 |
| 2002/0117695 A1 | 8/2002 | Borges | |
| 2002/0167019 A1* | 11/2002 | Nakamura et al. | 257/103 |
| 2003/0136333 A1 | 7/2003 | Semond et al. | |
| 2004/0104384 A1 | 6/2004 | Moustakas et al. | |
| 2004/0130002 A1 | 7/2004 | Weeks et al. | |
| 2004/0137685 A1* | 7/2004 | Lochtefeld et al. | 438/285 |
| 2005/0133818 A1 | 6/2005 | Johnson et al. | |
| 2005/0145851 A1 | 7/2005 | Johnson et al. | |
| 2005/0167775 A1 | 8/2005 | Nagy et al. | |
| 2005/0247942 A1* | 11/2005 | Hon et al. | 257/76 |
| 2005/0285142 A1 | 12/2005 | Piner et al. | |
| 2005/0285155 A1 | 12/2005 | Johnson et al. | |
| 2006/0006500 A1 | 1/2006 | Piner et al. | |
| 2006/0118819 A1 | 6/2006 | Hanson et al. | |

FOREIGN PATENT DOCUMENTS

| | | |
|---|---|---|
| EP | 1437764 A1 | 7/2004 |
| EP | 1548807 A1 | 6/2005 |
| WO | WO 96/41906 | 12/1996 |
| WO | WO 01/13436 A1 | 2/2001 |
| WO | WO 02/058164 A2 | 7/2002 |

OTHER PUBLICATIONS

Amano, H. et al., "Improvement of Crystalline Quality of Group III Nitrides on Sapphire Using Low Temperature Interlayers," MRS Internet J. Nitride Semicond. Res. 4S1, G10.1 (1999).

Beaumont, B. et al., "Lateral Overgrowth of GaN on Patterned GaN/Sapphire Substrate Via Selective Metal Organic Vapour Phase Epitaxy: A Route to Produce Self Supported GaN Substrates," J. Crystal Growth 189/190:97 (1998).

Brown, J.D. et al., "AlGaN/GaN HFETs Fabricated on 100-mm GaN on Silicon (111) Substrates," Solid-State Electronics 46:1535 (2002).

Brown, J.D. et al., "Performance of AlGaN/GaN HFETs Fabricated on 100mm Silicon Substrates for Wireless Basestation Applications," Nitronex Corporation, IEEE MTT-S Digest p. 833 (2004).

Bykhovski, A.D. et al., "Elastic Strain Relaxation in GaN-AlN-GaN Semiconductor-Insulator-Semiconductor Structures," J.Appl. Phys. 78(6):3691 (1995).

Chen, P. et al., "Growth of High Quality GaN Layers With AlN Buffer on Si(111) Substrates," J. Crystal Growth 225:150 (2001).

Dadgar, A. et al., "Bright, Crack-Free InGaN/GaN Light Emitters on Si(111)," Phys. Stat. Sol. 192(2):308 (2002).

Dadgar, A. et al., "Metalorganic Chemical Vapor Phase Epitaxy of Crack-Free GaN on Si(111) Exceeding 1 μm in Thickness," Jpn. J. Appl. Phys. 39:L1183 (2000).

Dadgar, A. et al., "MOVPE Growth of GaN on Si(111) Substrates," J. Crystal Growth 248:556 (2003).

Davis, R. et al., "Conventional and Pendeo-Epitaxial Growth of GaN(0001) Thin Films on Si(111) Substrates," J. Crystal Growth 231:335 (2001).

Elhamri, S. et al., "An Electrical Characterization of a Two Dimensional Electron Gas in GaN/AlGaN on Silicon Substrates," J. Appl. Phys. 95(12):7982 (2004).

Guha, S. et al., "Ultraviolet and Violet GaN Light Emitting Diodes on Silicon," Appl. Phys. Lett. 72(4):415 (1998).

Haffouz, S. et al., "The Effect of the Si/N Treatment of a Nitridated Sapphire Surface on the Growth Mode of GaN in Low-Pressure Metalorganic Vapor Phase Epitaxy," Appl. Phys. Lett. 73(9):1278 (1998).

Hageman, P.R. et al., "High Quality GaN Layers on Si(111) Substrates: AlN Buffer Layer Optimisation and Insertion of a SiN Intermediate Layer," Phys. Stat. Sol. 188(2):523 (2001).

Hanson, A.W. et al., "Development of a GaN Transistor Process for Linear Power Applications," Nitronex Corporation, Paper presented at the 2004 International Conference on Compound Semiconductor Manufacturing Technology (GaAs MANTECH), Miami, FL.

Hirosawa, K. et al., "Growth of Single Crystal $Al_2Ga_{1-\alpha}N$ Films on Si Substrates by Metalorganic Vapor Phase Epitaxy," Jpn. J. Appl. Phys. 32:L1039 (1993).

Ishikawa, H. et al., "High-Quality GaN on Si Substrate Using AlGaN/AlN Intermediate Layer," Phys. Stat. Sol. 176:599 (1999).

Johnson, J.W. et al., "12 W/mm AlGaN-GaN HFETs on Silicon Substrates," IEEE Electron Device Lett. 25(7):459 (2004).

Johnson, J.W. et al., "Material, Process, and Device Development of GaN-Based HFETs on Silicon Substrates," Nitronex Corporation, Electrochemical Society Proceedings 2004-06, 405 (2004).

Kang, B.S. et al., "Pressure-Induced Changes in the Conductivity of AlGaN/GaN High-Electron Mobility-Transistor Membranes," Appl. Phys. Lett. 85(14):2962 (2004).

Lahreche, H. et al., "Growth of High-Quality GaN by Low-Pressure Metal-Organic Vapour Phase Epitaxy (LP-MOVPE) From 3D Islands and Lateral Overgrowth," J. Crystal Growth 205:245 (1999).

Lahreche, H. et al., "Optimisation of AlN and GaN Growth by Metalorganic Vapour-Phase Epitaxy (MOVPE) on Si(111)," J. Crystal Growth 217:13 (2000).

Lee, I. et al., "Growth and Optical Properties of GaN on Si(111) Substrates," J. Crystal Growth 235:73 (2002).

Lei, T. et al., "Epitaxial Growth of Zinc Blende and Wurtzitic Gallium Nitride Thin Films on (001) Silicon," Appl. Phys. Lett. 59(8):944 (1991).

Liu, R. et al., "Atomic Arrangement at the AlN/Si (111) Interface," Appl. Phys. Lett. 83(5):860 (2003).

Nagy, W. et al., "Linearity Characteristics of Microwave Power GaN HEMTs," IEEE Transactions on Microwave Theory & Techniques 51(2):1 (2003).

Nakada, Y. et al., "GaN Heteroepitaxial Growth on Silicon Nitride Buffer Layers Formed on Si (111) Surfaces by Plasma-Assisted Molecular Beam Epitaxy," Appl. Phys. Lett. 73(6):827 (1998).

Nikishin, S.A. et al., "High Quality GaN Grown on Si(111) by Gas Source Molecular Beam Epitaxy with Ammonia," Appl. Phys. Lett. 75(14):2073 (1999).

Nuttinck, S. et al., "Direct On-Wafer Non-Invasive Thermal Monitoring of AlGaN/GaN Power HFETs Under Microwave Large Signal Conditions," Paper Presented at European Microwave Week, Amsterdam, NL (2004).

Ohtani, A. et al., "Microstructure and Photoluminescence of GaN Grown on Si(111) by Plasma-Assisted Molecular Beam Epitaxy," Appl. Phys. Lett. 65(1):61 (1994).

Okamoto, Y. et al., "An 80W AlGaN/GaN Heterojunction FET With a Field-Modulating Plate," IEEE MTT-S Digest p. 225 (2003).

Osinsky, A. et al., "Visible-Blind GaN Schottky Barrier Detectors Grown on Si(111)," Appl. Phys. Lett. 72(5):551 (1998).

Piner, E., "GaN Transistors and Power Amplifiers Close in on Commercialization," Compound Semiconductor (Jul. 2004).

Rajagopal, P. et al., "Large-Area, Device Quality GaN on Si Using a Novel Transition Layer Scheme," Nitronex Corporation, Material Research Society Symposium Proceedings 743(3) (2003)..

Rajagopal, P. et al., "MOCVD AlGaN/GaN HFETs on Si: Challenges and Issues," Symposium Y: GAN and Related Alloys, Nitronex Corporation, Material Research Society Symposium Proceedings, 798, 61-66 (2004).

Reitmeier, Z. et al., "Growth and Characterization of AlN and GaN Thin Films Deposited on Si(111) Substrates Containing a Very Thin Al Layer," Dept. Materials Science & Engineering, NC State University.

Semond, F. et al., "GaN Grown on Si(111) Substrate: From Two-Dimensional Growth to Quantum Well Assessment," Appl. Phys. Lett. 75(1):82 (1999).

Seon, M. et al., "Selective Growth of High Quality GaN on Si(111) Substrates," Appl. Phys. Lett. 76(14): 1842 (2000).

Singhal, S. et al., "Gallium Nitride on Silicon HEMTs for Wireless Infrastructure Applications, Thermal Design and Performance," Nitronex Corporation, Paper presented at the European Microwave Week, Milan, Italy (2002).

Tanaka, S. et al., "Anti-Surfactant in III-Nitride Epitaxy-Quantum Dot Formation and Dislocation Termination-," Jpn. J. Appl. Phys. 39:L831 (2000).

Tanaka, S. et al., "Defect Structure in Selective Area Growth GaN Pyramid on (111)Si Substrate," Appl. Phys. Lett. 76(19):2701 (2000).

Thompson, R. et al., "Improved Fabrication Process for Obtaining High Power Density AlGaN/GaN HEMTs," IEEE GaAs Digest p. 298 (2003).

Tolle, J. et al., "Epitaxial Growth of $Al_xGa_{1-x}N$ on Si(111) via a $ZrB_2(0001)$ Buffer Layer," App. Phys. Lett. 84(18):3510 (2004).

Tolle, J. et al., "Epitaxial Growth of Group III Nitrides on Silicon Substrates Via a Reflective Lattice-Matched Zirconium Diboride Buffer Layer," App. Phys. Lett. 82(15):2398 (2003).

Vennegues, P. et al., "Influence of in Situ Sapphire Surface Preparation and Carrier Gas on the Growth Mode of GaN in MOVPE," Crystal Growth 187:167 (1998).

Vescan, A. et5 al., "AlGaN/GaN HFETs on 100 mm Silicon Substrates for Commercial Wireless Applications," Phys. Stat. Sol. (c) 0(1):52 (2002).

Zhao, Z.M. et al., "Metal-Semiconductor-Metal GaN Ultraviolet Photodetectors on Si(111)," Appl. Phys. Lett. 77(3):444 (2000).

Office Action mailed Apr. 24, 2007 from U.S. Appl. No. 11/096,505.

Response to Office Action filed Aug. 30, 2007 from U.S. Appl. No. 11/096,505.

* cited by examiner

GALLIUM NITRIDE MATERIALS AND METHODS ASSOCIATED WITH THE SAME

FIELD OF INVENTION

The invention relates generally to gallium nitride materials and, more particularly, to gallium nitride material-based structures including a strain-absorbing layer, as well as methods associated with the same.

BACKGROUND OF INVENTION

Gallium nitride materials include gallium nitride (GaN) and its alloys such as aluminum gallium nitride (AlGaN), indium gallium nitride (InGaN), and aluminum indium gallium nitride (AlInGaN). These materials are semiconductor compounds that have a relatively wide, direct bandgap which permits highly energetic electronic transitions to occur. Such electronic transitions can result in gallium nitride materials having a number of attractive properties including the ability to efficiently emit blue light, the ability to transmit signals at high frequency, and others. Accordingly, gallium nitride materials are being widely investigated in many microelectronic applications such as transistors, field emitters, and optoelectronic devices.

In many applications, gallium nitride materials are grown on a substrate. However, differences in the properties between gallium nitride materials and substrates can lead to difficulties in growing layers suitable for many applications. For example, gallium nitride (GaN) has a different thermal expansion coefficient (i.e., thermal expansion rate) and lattice constants than many substrate materials including sapphire, silicon carbide and silicon. This differences in thermal expansion and lattice constants may lead to formation of defects including misfit dislocations. Misfit dislocations may have a number of negative effects including degrading overlying semiconductor material regions when the dislocations propagate to those regions, creation of electronic states within energy bands of those regions that negatively effect device performance, and promoting formation of other types of crystal defects (e.g., point defects, line defects and planar defects). These effects can negatively impact device performance.

SUMMARY OF INVENTION

The invention provides semiconductor structures including structures that comprise a gallium nitride material region and a strain-absorbing layer, as well as methods associated with the same.

In one embodiment, a semiconductor structure is provided. The structure comprises a silicon substrate having a top surface; and, an amorphous silicon nitride-based material layer covering a majority of the top surface of the substrate. A nitride-based material overlying layer is formed on the silicon nitride-based material layer.

In another embodiment, a semiconductor structure is provided. The structure comprises a silicon substrate including a top surface; and, a silicon nitride-based material layer having a thickness of less than 100 Angstroms and covering a majority of the top surface of the substrate. A single crystal nitride-based material overlying layer is formed on the silicon nitride-based material layer.

In another embodiment, a semiconductor structure is provided. The structure comprises a silicon substrate including a top surface; and, an amorphous silicon nitride-based material layer covering substantially the entire top surface of the silicon substrate and having a thickness of less than 100 Angstroms. A compositionally-graded transition layer is formed on the amorphous silicon nitride-based material layer. A gallium nitride material region is formed on the transition layer.

In another embodiment, a semiconductor structure is provided. The structure comprises a semiconductor material region; and, a strain-absorbing layer formed on the semiconductor material region. A nitride-based material layer is formed directly on the strain-absorbing layer, wherein the misfit dislocation density in the nitride-based material layer is less than about $10^{10}$ defects/cm$^2$.

In another embodiment, a method of forming a semiconductor structure is provided. The method comprises providing a silicon substrate in a reaction chamber; and, introducing a nitrogen source into the reaction chamber to form an amorphous silicon nitride-based material layer. The method further comprises introducing a second source into the reaction chamber to form a nitride-based material overlying layer on the silicon nitride-based material layer.

Other aspects, embodiments and features of the invention will become apparent from the following detailed description of the invention when considered in conjunction with the accompanying drawings. The accompanying figures are schematic and are not intended to be drawn to scale. In the figures, each identical, or substantially similar component that is illustrated in various figures is represented by a single numeral or notation. For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

The invention provides semiconductor structures including a gallium nitride material region and methods associated with such structures. The semiconductor structures can include a strain-absorbing layer formed within the structure. The strain-absorbing layer may be formed between the substrate (e.g., a silicon substrate) and an overlying layer, or between layers within the structure. As described further below, it may be preferable for the strain-absorbing layer to be very thin, have an amorphous structure and be formed of a silicon nitride-based material. The strain-absorbing layer may reduce the number of misfit dislocations formed in the overlying layer (e.g., a nitride-based material layer) which may limit formation of other types of defects in other overlying layers (e.g., gallium nitride material region), amongst other advantages. Thus, the presence of the strain-absorbing layer may improve the quality of the gallium nitride material region which can lead to improved device performance.

Figure 1:
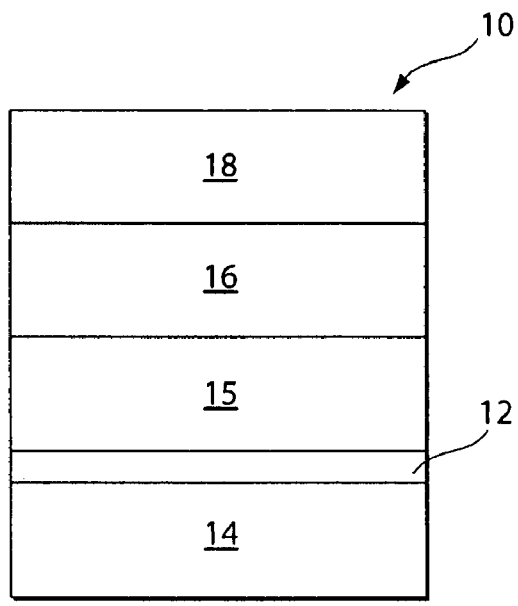
FIG. 1 illustrates a gallium nitride material-based semiconductor structure including a strain-absorbing layer according to one embodiment of the present invention.

FIG. 1 illustrates a semiconductor structure 10 according to one embodiment of the invention. In the illustrative embodiment, the semiconductor structure includes a strain-absorbing layer 12 formed between a substrate 14 and an overlying layer 15. As shown, the structure includes a transition layer 16 formed on the overlying layer and a gallium nitride material region 18 formed on the transition layer. As described further below, the composition, thickness and crystal structure of the strain-absorbing layer may contribute to reducing the number of misfit dislocations in the overlying layer which may decrease defect formation in the gallium nitride material region. This increases the quality of the gallium nitride material region and improves device performance. Semiconductor structures of the invention may form the basis of a number of semiconductor devices including transistors (e.g., FET), Schottky diodes, light emitting diodes and laser diodes, amongst others.

When a layer is referred to as being "on" or "over" another layer or substrate, it can be directly on the layer or substrate, or an intervening layer also may be present. A layer that is "directly on" another layer or substrate means that no intervening layer is present. It should also be understood that when a layer is referred to as being "on" or "over" another layer or substrate, it may cover the entire layer or substrate, or a portion of the layer or substrate.

The strain-absorbing layer helps absorb strain that arises due to lattice differences between the crystal structure of the substrate and the crystal structure of overlying layer 15 (e.g., when overlying layer 15 is formed of an aluminum nitride-based or gallium nitride material). In the absence of the strain-absorbing layer, this strain is typically accommodated by the generation of misfit dislocations in overlying layer 15 at the interface with the substrate. Thus, by providing an alternative mechanism for accommodating stress, the presence of the strain-absorbing layer may reduce the generation of misfit dislocations.

Furthermore, the strain-absorbing layer can help absorb strain that arises due to differences in the thermal expansion rate of the substrate as compared to the thermal expansion rate of the overlying layer and/or the gallium nitride material region. Such differences can lead to formation of misfit dislocations at the overlying layer/substrate interface, or cracking in either the overlying layer and/or gallium nitride material region. As described further below, transition layer 16 also helps absorb this thermally-induced strain.

In certain preferred embodiments, strain-absorbing layer 12 is formed of a silicon nitride-based material. Silicon nitride-based materials include any silicon nitride-based compound (e.g., $Si_xN_y$, such as SiN and $Si_3N_4$, SiCN, amongst others) including non-stoichiometric silicon nitride-based compounds. In some embodiments, a SiN strain-absorbing layer may be preferred. Silicon nitride material-based strain-absorbing layers may be particularly preferred when formed directly on a silicon substrate, as described further below.

It should also be understood that it is possible for the strain-absorbing layer to be formed of other types of materials according to other embodiments of the invention. Though all of the advantages associated with silicon nitride-based materials may not be achieved in these embodiments.

In some embodiments, it is preferable for the strain-absorbing layer to have an amorphous (i.e., non-crystalline) crystal structure. Amorphous strain-absorbing layers are particularly effective in accommodating strain and, thus, reducing the generation of misfit dislocations.

However, it should be understood that in certain embodiments of the invention the strain-absorbing layer may have a single crystal or poly-crystalline structure. In these cases, however, all of the advantages associated with the amorphous layer may not be realized.

In some embodiments, it is preferred for the strain-absorbing layer to be very thin, particularly when formed of amorphous and/or silicon nitride-based materials. It has been discovered that very thin strain-absorbing layers (e.g., silicon nitride-based strain-absorbing layers) may enable formation of overlying layer(s) having an epitaxial relationship with the substrate, while also being effective in reducing the number of misfit dislocations. In certain cases (e.g., when the strain-absorbing layer is amorphous), it is desirable for the strain-absorbing layer to have a thickness that is large enough to accommodate sufficient strain associated with lattice and thermal expansion differences between the substrate and overlying layer 15 to reduce generation of misfit dislocations. In these cases, it may also be desirable for the strain-absorbing layer to be thin enough so that the overlying layer has an epitaxial relationship with the substrate. This can be advantageous for formation of a high quality, single crystal gallium nitride material region. If the strain-absorbing layer is too thick, then the overlying layer is not formed with epitaxial relationship with the substrate.

In some embodiments, the strain-absorbing layer has a thickness of less than about 100 Angstroms which, in these embodiments, can allow the epitaxial relationship between the substrate and the overlying layer. In some embodiments, it may be preferable for the strain-absorbing layer to have a thickness of less than about 50 Angstroms to allow for the epitaxial relationship.

The strain-absorbing layer may have a thickness of greater than about 10 Angstroms which, in these embodiments, is sufficient to accommodate strain (e.g., resulting from lattice and thermal expansion differences) and can facilitate forming a strain-absorbing layer that covers the entire substrate, as described further below. In other embodiments, the strain-absorbing layer may have a thickness of greater than about 20 Angstroms to sufficiently accommodate strain.

Suitable thickness ranges for the strain-absorbing layer include all of those defined by the ranges described above (e.g., greater than about 10 Angstroms and less than about 100 Angstroms, greater than about 10 Angstroms and less than about 50 Angstroms, and the like). Also, the strain-absorbing layer thickness may be between about 20 Angstroms and about 70 Angstroms.

It should be understood that suitable thicknesses of the strain-absorbing layer may depend on a number of factors including the composition and crystal structure of the strain-absorbing layer; the composition, thickness and crystal structure of the overlying layer; as well as the composition, thickness, and crystal structure of the substrate, amongst other factors. Suitable thicknesses may be determined by measuring the effect of thickness on misfit dislocation density and other factors (e.g., the ability to deposit an overlying layer having an epitaxial relationship with the substrate, etc.). It is also possible for the strain-absorbing layer to have a thickness outside the above ranges.

In some cases, the thickness of the strain-absorbing layer is relatively uniform across the entire layer. For example, in these cases, the strain-absorbing layer may have a thickness uniformity variation of less than 25 percent, or less than 10 percent, across the entire strain-absorbing layer.

As described further below, in some embodiments, the strain-absorbing layer may be formed by nitridating a top surface region of a silicon substrate. That is, the surface region of the substrate may be converted from silicon to a silicon nitride-based material to form the strain-absorbing layer. It should be understood that, as used herein, such strain-absorbing layers may be referred to as being "formed on the substrate", "formed over the substrate", "formed directly on the substrate" and as "covering the substrate". Such phrases also refer to strain-absorbing layers that are formed by depositing a separate layer (e.g., using a separate nitrogen source and silicon source) on the top surface of the substrate and are not formed by converting a surface region of the substrate.

In the illustrative embodiment, the strain-absorbing layer covers substantially the entire top surface of the substrate. This arrangement may be preferable to minimize the number of misfit dislocations in the overlying layer. In other embodiments, the strain-absorbing layer may cover a majority of the top surface of the substrate (e.g., greater than 50 percent or greater than 75 percent of the top surface area).

Also, in the illustrative embodiment, strain-absorbing layer 12 is formed across the entire area between the substrate and the overlying layer. That is, the strain-absorbing layer separates the substrate and the overlying layer at all points with the strain-absorbing layer being directly on the substrate and the overlying layer being directly on the strain-absorbing layer. This arrangement may be preferable to minimize the number of misfit dislocations in the overlying layer. In other embodiments, the strain-absorbing layer may be formed across a majority of the area (e.g., greater than 50 percent, or greater than 75 percent) between the substrate and the overlying layer. If the strain-absorbing layer is not present across the entire (or, at least, the majority of the) area between the substrate and the overlying layer, the above-noted advantages associated with the strain-absorbing layer may not be realized.

The extent that the strain-absorbing layer covers the substrate (and the area between the overlying layer and the substrate) in the present invention may be distinguished from certain prior art techniques in which a discontinuous silicon nitride layer is formed (in some cases, inadvertently) between a silicon substrate and an overlying layer.

Figure 3:
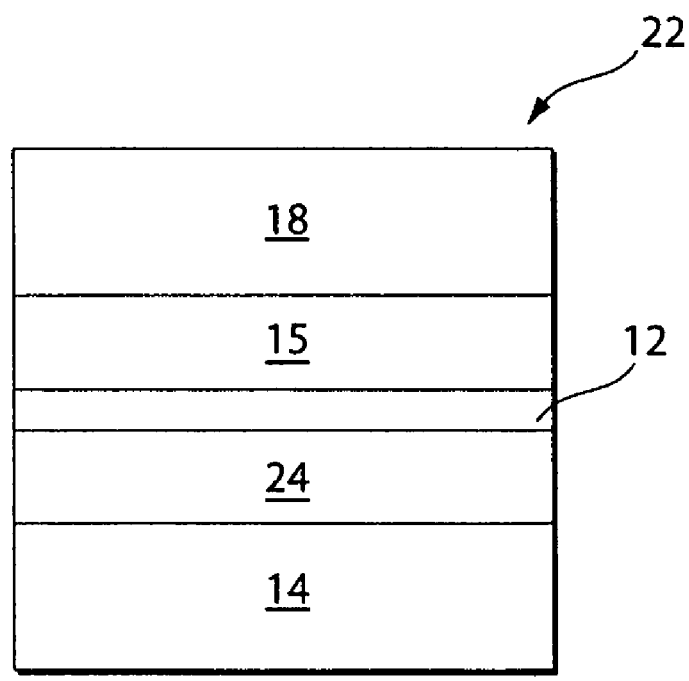
FIG. 3 illustrates a gallium nitride material-based semiconductor structure including a strain-absorbing layer formed between layers within the structure according to another embodiment of the present invention.

It should be understood that, in other embodiments, the strain-absorbing layer may be positioned in other locations such as between two different layers (e.g., the embodiment of FIG. 3). In these embodiments, the strain-absorbing layer may reduce the formation of misfit dislocations in the layer that overlies the strain-absorbing layer.

As noted above, the presence of the strain-absorbing layer advantageously results in very low misfit dislocation densities within the overlying layer (e.g., at, or very near, an interface between the strain-absorbing layer and the overlying layer). Misfit dislocations typically are formed at (or, very near) the interface between two materials as a result of incoherency due to differences in atomic structures of the materials.

In some embodiments of the invention, the misfit dislocation density in the overlying layer is less than about $10^{10}$ defects/cm$^2$; and, in other embodiments, less than about $10^8$ defects/cm$^2$. Even lower misfit dislocation densities in the overlying layer may be achieved, for example, less than about $10^5$ defects/cm$^2$. In some cases, the presence of misfit dislocations may not be readily detectable which generally means that the misfit dislocation density is less than about $10^2$ defects/cm$^2$. The specific misfit dislocation density depends, in part, on the particular structure including factors such as the thickness, composition and crystal structure of the strain-absorbing layer; the composition, thickness and crystal structure of the overlying layer; as well as the composition, thickness, and crystal structure of the substrate, amongst other factors.

It should be understood that the above-described misfit dislocation density ranges may be found in the overlying layer at, or very near (e.g., 20 nm), the interface with the strain-absorbing layer; and, also may be found at other regions within the overlying layer.

Misfit dislocation density may be measured using known techniques. The techniques generally involve inspection of the atomic structure of a sample (e.g., an interface) using high magnification to determine the presence of misfit dislocations over a representative area. For example, high resolution transmission electron microscopy (TEM) may be used. One suitable technique involves counting the number of dislocations over a representative area using high resolution-TEM images. The misfit dislocation density is calculated by dividing the number of dislocations by the area. Typically, the misfit dislocation density is expressed in units of defects/cm$^2$.

It should be understood that, in certain embodiments of the invention, the overlying layer may have misfit dislocation densities greater than the above-noted ranges.

The very low misfit dislocation densities achievable in the overlying layer in structures of the present invention may lead to a number of advantages including reducing defects in the gallium nitride material region, as described further below.

It may be preferred for structure 10 to include an overlying layer 15 formed of a nitride-based material. Suitable nitride-based materials include, but are not limited to, aluminum nitride-based materials (e.g., aluminum nitride, aluminum nitride alloys) and gallium nitride based-materials (e.g., gallium nitride, gallium nitride alloys). In some cases, the overlying layer has a constant composition. In other cases, as described further below, the overlying layer may be compositionally-graded. Suitable compositionally-graded layers are described further below and have been described in commonly-owned U.S. Pat. No. 6,649,287, entitled "Gallium Nitride Materials and Methods" filed on Dec. 14, 2000, which is incorporated herein by reference.

It may be preferable for the overlying layer to have a single crystal structure. As noted above, in some embodiments, the thickness of the strain-absorbing layer is controlled so that the overlying layer has an epitaxial relationship with the substrate. It may be advantageous for the overlying layer to have a single crystal structure because it facilitates formation of a single crystal, high quality gallium nitride material region. In some embodiments, the overlying layer has a different crystal structure than the substrate. It should also be understood that the overlying layer may not have a single crystal structure and may be amorphous or polycrystalline, though all of the advantages associated with the single crystal overlying layers may not be achieved.

The overlying layer may have any suitable thickness. For example, the overlying layer may be between about 10 nanometers and 5 microns, though other thicknesses are also possible.

In the illustrative embodiment, transition layer 16 is formed directly on the overlying layer. In certain embodiments, such as when the overlying layer has a constant composition, it may be preferred for the transition layer to be formed of a compositionally-graded material (e.g., a compositionally-graded nitride-based material). Suitable compositionally-graded layers have been described in commonly-owned U.S. Pat. No. 6,649,287 which is incorporated by reference above. Compositionally-graded transition layers have a composition that is varied across at least a portion of the layer. Compositionally-graded transition layers are particularly effective in reducing crack formation in gallium nitride material regions formed on the transition layer by lowering thermal stresses that result from differences in thermal expansion rates between the gallium nitride material and the substrate (e.g., silicon).

According to one set of embodiments, the transition layer is compositionally-graded and formed of an alloy of gallium nitride such as $Al_xIn_yGa_{(1-x-y)}N$, $Al_xGa_{(1-x)}N$, and $In_yGa_{(1-y)}N$. In these embodiments, the concentration of at least one of the elements (e.g., Ga, Al, In) of the alloy is varied across at least a portion of the thickness of the transition layer. When transition layer 16 has an $Al_xIn_yGa_{(1-x-y)}N$ composition, x and/or y may be varied. When the transition layer has a $Al_xGa_{(1-x)}N$ composition, x may be varied. When the transition layer has a $In_yGa_{(1-y)}N$ composition, y may be varied.

In certain preferred embodiments, it is desirable for the transition layer to have a low gallium concentration at a back surface which is graded to a high gallium concentration at a front surface. It has been found that such transition layers are particularly effective in relieving internal stresses within gallium nitride material region 18. For example, the transition layer may have a composition of $Al_xGa_{(1-x)}N$, where x is decreased from the back surface to the front surface of the transition layer (e.g., x is decreased from a value of 1 at the back surface of the transition layer to a value of 0 at the front surface of the transition layer).

In one preferred embodiment, structure 10 includes an aluminum nitride overlying layer 15 and a compositionally-graded transition layer 16. The compositionally-graded transition layer may have a composition of $Al_xGa_{(1-x)}N$, where x is graded from a value of 1 at the back surface of the transition layer to a value of 0 at the front surface of the transition layer. The composition of the transition layer, for example, may be graded discontinuously (e.g., step-wise) or continuously. One discontinuous grade may include steps of AlN, $Al_{0.6}Ga_{0.4}N$ and $Al_{0.3}Ga_{0.7}N$ proceeding in a direction toward the gallium nitride material region.

Figure 2:
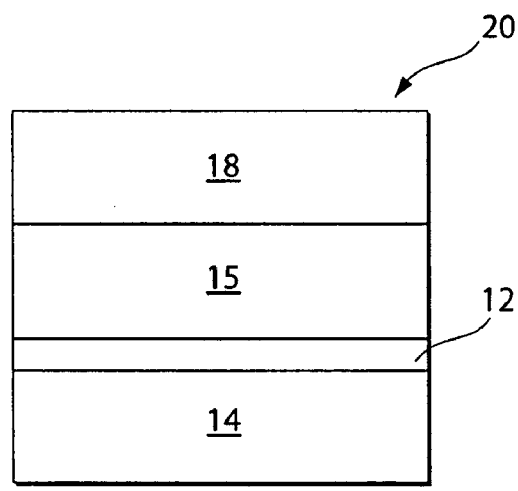
FIG. 2 illustrates a gallium nitride material-based semiconductor structure including a strain-absorbing layer according to another embodiment of the present invention.

It should be understood that, in other cases, transition layer 16 may have a constant composition and may not be compositionally-graded (e.g., when the overlying layer is compositionally-graded). It should also be understood that in some embodiments of the invention, as shown in FIG. 2, a separate transition layer is not present between the overlying layer and the gallium nitride material region. In the illustrative embodiment of FIG. 2, structure 20 includes overlying layer 15 formed directly on top of strain-absorbing layer 12 and gallium nitride material region 18 formed directly on the overlying layer. In this embodiment, it may be preferable for the overlying layer to be compositionally-graded as described above.

The overlying layer and/or transition layer are typically (though not always) not part of the active region of the device. As described above, the overlying layer and/or transition layer may be formed to facilitate deposition of gallium nitride material region 18. However, in some cases, the overlying layer and/or transition layer may have other functions including functioning as a heat spreading layer that helps remove heat from active regions of the semiconductor structure during operation of a device. For example, such transition layers that function as heat spreading layers have been described in commonly-owned, co-pending U.S. patent application Ser. No. 09/792,409 entitled "Gallium Nitride Materials Including Thermally-Conductive Regions," filed Feb. 23, 2001, which is incorporated herein by reference.

Active regions of the device may be formed in gallium nitride material region 18. Gallium nitride material region 18 comprises at least one gallium nitride material layer. As used herein, the phrase "gallium nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosporide nitride ($GaAs_aP_bN_{(1-a-b)}$), aluminum indium gallium arsenide phosporide nitride ($Al_xIn_yGa_{(1-x-y)}As_aP_bN_{(1-a-b)}$), amongst others. Typically, when present, arsenic and/or phosphorous are at low concentrations (i.e., less than 5 weight percent). In certain preferred embodiments, the gallium nitride material has a high concentration of gallium and includes little or no amounts of aluminum and/or indium. In high gallium concentration embodiments, the sum of (x+y) may be less than 0.4, less than 0.2, less than 0.1, or even less. In some cases, it is preferable for the gallium nitride material layer to have a composition of GaN (i.e., x+y=0). Gallium nitride materials may be doped n-type or p-type, or may be intrinsic. Suitable gallium nitride materials have been described in U.S. Pat. No. 6,649,287, incorporated by reference above.

Figure 4:
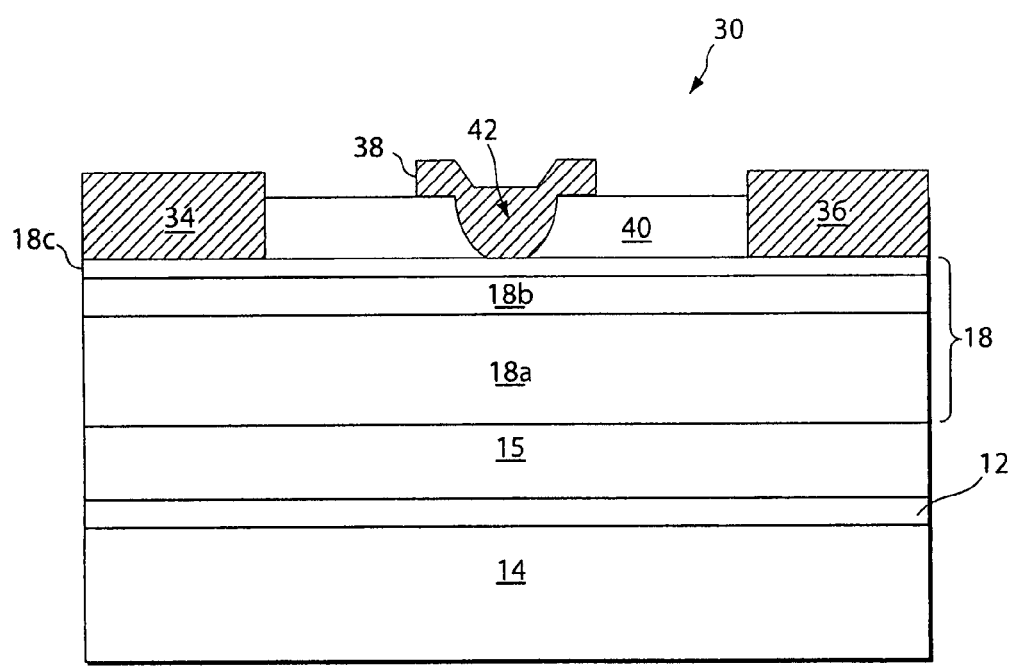
FIG. 4 schematically illustrates a FET device including a strain-absorbing layer according to another embodiment of the invention.

In some cases, gallium nitride material region 18 includes only one gallium nitride material layer. In other cases, gallium nitride material region 18 includes more than one gallium nitride material layer. For example, the gallium nitride material region may include multiple layers (e.g., 18a, 18b, 18c) as shown in FIG. 4. In certain embodiments, it may be preferable for the gallium nitride material of layer 18b to have an aluminum concentration that is greater than the aluminum concentration of the gallium nitride material of layer 18a. For example, the value of x in the gallium nitride material of layer 18b (with reference to any of the gallium nitride materials described above) may have a value that is between 0.05 and 1.0 greater than the value of x in the gallium nitride material of layer 18a, or between 0.05 and 0.5 greater than the value of x in the gallium nitride material of layer 18a. For example, layer 18b may be formed of $Al_{0.26}Ga_{0.74}N$, while layer 18a is formed of GaN. This difference in aluminum concentration may lead to formation of a highly conductive region at the interface of the layers 18b, 18a (i.e., a 2-D electron gas region). In the illustrative embodiment, layer 18c may be formed of GaN.

Suitable gallium nitride material layer arrangements have been described, for example, in commonly-owned, co-pending U.S. patent application Ser. No. 10/740,376 entitled "Gallium Nitride Material Devices Including an Electrode- Defining Layer and Methods of Forming the Same," filed Dec. 17, 2003 which is incorporated herein by reference.

Gallium nitride material region 18 also may include one or more layers that do not have a gallium nitride material composition such as other III-V compounds or alloys, oxide layers, and metallic layers.

Gallium nitride material region 18 is of high enough quality so as to permit the formation of devices therein. As noted above, the presence of the strain-absorbing layer may reduce the misfit dislocation density in the overlying layer which can reduce formation of defects in the gallium nitride material region. For example, the generation of point defects, line defects, and planar defects may be reduced. By limiting defect generation in the gallium nitride material region, device performance can be improved. The low misfit dislocation densities can also limit creation of electronic states within energy bands of the gallium nitride material regions which also negatively effect device performance.

Preferably, gallium nitride material region 18 also has a low crack level. As described above, the transition layer (particularly when compositionally-graded) and/or overlying layer may reduce crack formation. Gallium nitride materials having low crack levels have been described in U.S. Pat. No. 6,649,287 incorporated by reference above. In some cases, the gallium nitride material region has a crack level of less than 0.005 $\mu m/\mu m^2$. In some cases, the gallium nitride material region has a very low crack level of less than 0.001 $\mu m/\mu m^2$. In certain cases, it may be preferable for the gallium nitride material region to be substantially crack-free as defined by a crack level of less than 0.0001 $\mu m/\mu m^2$.

In certain cases, gallium nitride material region 18 includes a layer (or layers) which have a single crystal (i.e., monocrystalline) structure. In some cases, the gallium nitride material region includes one or more layers having a Wurtzite (hexagonal) structure.

The thickness of gallium nitride material region 18 and the number of different layers are dictated, at least in part, by the requirements of the specific device. At a minimum, the thickness of the gallium nitride material region is sufficient to permit formation of the desired structure or device. The gallium nitride material region generally has a thickness of greater than 0.1 micron, though not always. In other cases, gallium nitride material region 18 has a thickness of greater than 0.5 micron, greater than 2.0 microns, or even greater than 5.0 microns.

As described above, in certain preferred embodiments, substrate 14 is a silicon substrate. As used herein, a silicon substrate refers to any substrate that includes a silicon surface. Examples of suitable silicon substrates include substrates that are composed entirely of silicon (e.g., bulk silicon wafers), silicon-on-insulator (SOI) substrates, silicon-on-sapphire substrate (SOS), and SIMOX substrates, amongst others. Suitable silicon substrates also include substrates that have a silicon wafer bonded to another material such as diamond, AlN, or other polycrystalline materials. Silicon substrates having different crystallographic orientations may be used, though single crystal silicon substrates are preferred. In some cases, silicon (111) substrates are preferred. In other cases, silicon (100) substrates are preferred.

It should be understood that other types of substrates may also be used including sapphire, silicon carbide, indium phosphide, silicon germanium, gallium arsenide, gallium nitride, aluminum nitride, or other III-V compound substrates. However, in embodiments that do not use silicon substrates, all of the advantages associated with silicon substrates may not be achieved. In some embodiments, it may be preferable to use non-nitride material-based substrates such as silicon, sapphire, silicon carbide, indium phosphide, silicon germanium and gallium arsenide.

Substrate 14 may have any suitable dimensions and its particular dimensions are dictated by the application. Suitable diameters include, but are not limited to, about 2 inches (50 mm), 4 inches (100 mm), 6 inches (150 mm), and 8 inches (200 mm). Advantageously, the strain-absorbing layer may be used to form a high quality gallium nitride material region on substrates (e.g., silicon substrates) over a variety of thicknesses. In some cases, it may be preferable for the substrate to be relatively thick, such as greater than about 125 micron (e.g., between about 125 micron and about 800 micron, or between about 400 micron and 800 micron). Relatively thick substrates may be easy to obtain, process, and can resist bending which can occur, in some cases, in thinner substrates. In other embodiments, thinner substrates (e.g., less than 125 microns) are used, though these embodiments may not have the advantages associated with thicker substrates, but can have other advantages including facilitating processing and/or reducing the number of processing steps. In some processes, the substrate initially is relatively thick (e.g., between about 200 microns and 800 microns) and then is thinned during a later processing step (e.g., to less than 150 microns).

In some preferred embodiments, the substrate is substantially planar in the final device or structure. Substantially planar substrates may be distinguished from substrates that are textured and/or have trenches formed therein (e.g., as in U.S. Pat. No. 6,265,289). As shown, the layers/regions of the device (e.g., strain-absorbing layer, overlying layer, transition layer, gallium nitride material region) may also be substantially planar in the final device or structure. As described further below, such layers/regions may be grown in vertical (e.g., non-lateral) growth processes. Planar substrates and layers/regions can be advantageous in some embodiments, for example, to simplify processing. Though it should be understood that, in some embodiments of the invention, lateral growth processes may be used as described further below.

FIG. 3 illustrates a semiconductor structure 22 according to another embodiment of the invention. In this embodiment, strain-absorbing layer 12 is formed between layers within the structure, and is not formed directly on the substrate. For example, the strain-absorbing layer may be formed between an underlying layer 24 and an overlying layer 15. In this embodiment, the strain-absorbing layer may reduce the formation of misfit dislocations in overlying layer 15 as described above in connection with the embodiments of FIG. 1.

Underlying layer 24 may be formed of a variety of semiconductor materials. In some embodiments, the underlying layer is formed of a nitride-based material. Suitable nitride-based materials include, but are not limited to, aluminum nitride-based materials (e.g., aluminum nitride, aluminum nitride alloys) and gallium nitride materials. In some embodiments, it may be preferred for the underlying material to have a different composition than the overlying material. The underlying layer may also have a different crystal structure than the overlying layer.

In other embodiments, the underlying material may be formed of non-nitride based materials.

The semiconductor structures illustrated in FIGS. 1-3 may form the basis of a variety of semiconductor devices. Suitable devices include, but are not limited to, transistors (e.g., FETs) as well as light-emitting devices including LEDs and laser diodes. The devices have active regions that are typically, at least in part, within the gallium nitride material region. Also, the devices include a variety of other functional layers and/or features (e.g., electrodes).

The strain-absorbing layer may be included in structures and devices described in commonly-owned, co-pending U.S. patent application Ser. No. 10/740,376, incorporated by reference above. For example, FIG. 4 schematically illustrates a FET device 30 according to one embodiment of the invention which is similar to a FET device described in U.S. patent application Ser. No. 10/740,376 except device 30 includes strain-absorbing layer 12. Device 30 includes a source electrode 34, a drain electrode 36 and a gate electrode 38 formed on gallium nitride material region 18 (which includes a first layer 18b and a second layer 18a). The device also includes an electrode defining layer 40 which, as shown, is a passivating layer that protects and passivates the surface of the gallium nitride material region. A via 42 is formed within the electrode defining layer in which the gate electrode is, in part, formed. Strain-absorbing layer 12 is formed directly on the substrate and overlying layer 15 is formed directly on the strain-absorbing layer. In some embodiments, the overlying layer is compositionally-graded. In some embodiments, the overlying layer may have a constant composition (e.g., aluminum nitride or an aluminum nitride alloy) and a compositionally-graded transition layer is formed on the strain-absorbing layer.

The strain-absorbing layer may also be included in structures and devices described in U.S. Pat. No. 6,649,287 which is incorporated herein by reference above.

The strain-absorbing layer may also be included in structures and devices described in commonly-owned U.S. Pat. No. 6,611,002 entitled "Gallium Nitride Material Devices and Methods Including Backside Vias" which is incorporated herein by reference.

It should be understood that other structures and devices that use the strain-absorbing layer may be within the scope of the present invention including structures and devices that are not specifically described herein. Other structures may include other layers and/or features, amongst other differences.

Semiconductor structure 10 may be manufactured using known semiconductor processing techniques. In embodiments in which the strain-absorbing layer is a silicon nitride-based material (e.g., amorphous SiN), the strain-absorbing layer may be formed by nitridating a top surface of the silicon substrate as noted above. In a nitridation process, nitrogen reacts with a top surface region of the silicon substrate to form a silicon nitride-based layer. The top surface may be nitridated by exposing the silicon substrate to a gaseous source of nitrogen at elevated temperatures. For example, ammonia may be introduced into a reaction chamber in which a silicon substrate is positioned. The temperature in the reaction chamber may be between about 1000° C. and about 1100° C. and the pressure may be between about 20 torr and about 40 torr (in some cases, about 30 torr). The reaction between nitrogen and the silicon substrate is allowed to proceed for a reaction time selected to produce a layer having a desired thickness.

It should be understood that other processes may be used to form silicon nitride-based strain-absorbing layers including processes (e.g., CVD processes) that use separate nitrogen and silicon sources. Also, when the strain-absorbing layer is formed of another type of material (non-silicon nitride-based material), other deposition processes known in the art are used.

In some embodiments, the strain-absorbing layer may be formed in-situ with the overlying layer (and, in some cases, subsequent layers) of the structure. That is, the strain-absorbing layer may be formed during the same deposition step as the overlying layer (and, in some cases, subsequent layers). In processes that grow a silicon nitride-based material strain-absorbing layer by introducing a nitrogen source (e.g., ammonia) into a reaction chamber as described above, a second source gas may be introduced into the chamber after a selected time delay after the nitrogen source. The second source reacts with the nitrogen source to form the overlying layer, thus, ending growth of the strain-absorbing layer. For example, when the overlying layer is formed of aluminum nitride, an aluminum source (e.g., trimethylaluminum) is introduced into the chamber at a selected time after the nitrogen source (e.g., ammonia). The time delay is selected so that the strain-absorbing layer grows to a desired thickness. The reaction between the second source (e.g., aluminum source) and the nitrogen source is allowed to proceed for a sufficient time to produce the overlying layer. When the overlying layer has a single crystal structure, the reaction conditions are selected appropriately. For example, the reaction temperature may be greater than 700° C., such as between about 1000° C. and about 1100° C. In some cases, lower growth temperatures may be used including temperatures between about 500° C. and about 600° C.

It should also be understood that the strain-absorbing layer may be formed in a separate process than the overlying layer and subsequent layers. For example, the strain-absorbing layer may be formed on the substrate in a first process. Then, at a later time, the overlying layers may be formed on the strain-absorbing layer in a second process.

In the processes described above, the overlying layer is grown in a vertical growth process. That is, the overlying layer is grown in a vertical direction with respect to the strain-absorbing layer. The ability to vertically grow the strain-absorbing layer having low misfit dislocation densities may be advantageous as compared to lateral growth processes which may be more complicated.

Transition layer 16 and gallium nitride material region 18 may also be grown in the same deposition step as the overlying layer and the strain-absorbing layer. In such processes, suitable sources are introduced into the reaction chamber at appropriate times. Suitable MOCVD processes to form compositionally-graded transition layers and gallium nitride material region over a silicon substrate have been described in U.S. Pat. No. 6,649,287 incorporated by reference above. When gallium nitride material region 18 has different layers, in some cases, it is preferable to use a single deposition step to form the entire region 18. When using the single deposition step, the processing parameters may be suitably changed at the appropriate time to form the different layers.

It should also be understood that the transition layer and the gallium nitride material region may be grown separately from the strain-absorbing layer and overlying layer. The gallium nitride material region and transition layer may be grown in a vertical growth process. That is, these regions are grown in a vertical direction with respect to underlying layers. The ability to vertically grow the gallium nitride material region having low misfit dislocation densities may be advantageous as compared to lateral growth processes which may be more complicated.

However, in other embodiments of the invention (not shown), it is possible to grow, at least a portion of, gallium nitride material region 18 using a lateral epitaxial overgrowth (LEO) technique that involves growing an underlying gallium nitride layer through mask openings and then laterally over the mask to form the gallium nitride material region, for example, as described in U.S. Pat. No. 6,051,849.

In other embodiments of the invention (not shown), it is possible to grow the gallium nitride material region 18 using a pendeoepitaxial technique that involves growing sidewalls of gallium nitride material posts into trenches until growth from adjacent sidewalls coalesces to form a gallium nitride material region, for example, as described in U.S. Pat. No. 6,265,289. In these lateral growth techniques, gallium nitride material regions with very low defect densities are achievable. For example, at least a portion of the gallium nitride material region may have a defect density of less than about $10^5$ defects/cm$^2$.

Commonly-owned, co-pending U.S. patent application Ser. No. 10/740,376, incorporated by reference above, further describes techniques used to grow other layers and features shown in the embodiment of FIG. 4.

It should also be understood that other processes may be used to form structures and devices of the present invention as known to those of ordinary skill in the art.

The following examples are meant to be illustrative and is not limiting.

EXAMPLE 1

This example illustrates the formation of a silicon nitride-based material strain-absorbing layer on a silicon substrate according to one embodiment of the present invention.

A 100 mm silicon substrate was placed in a reaction chamber. Ammonia gas was introduced into the chamber as a nitrogen source. The temperature was maintained at 1030° C. and the pressure at about 30 torr. A layer of amorphous silicon nitride (SiN) was formed.

About 6 seconds after the introduction of ammonia, TMA was introduced into the chamber as an aluminum source. The temperature and pressure were respectively maintained at 1030° C. and about 30 torr. Growth proceeded for 30 minutes.

Figure 5:
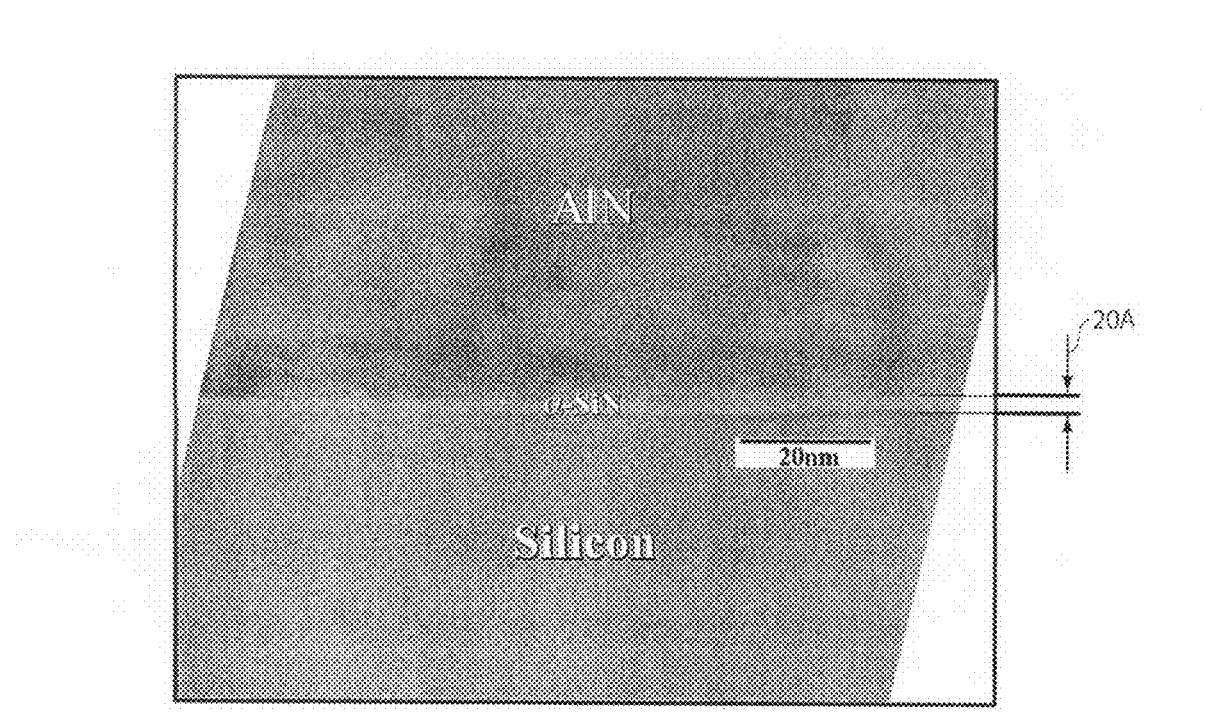
FIG. 5 is a copy of a STEM (scanning transmission electron microscope) image that illustrates the presence of a silicon nitride strain-absorbing layer between an aluminum nitride layer and a silicon substrate as described in Example 1.
Figure 6:
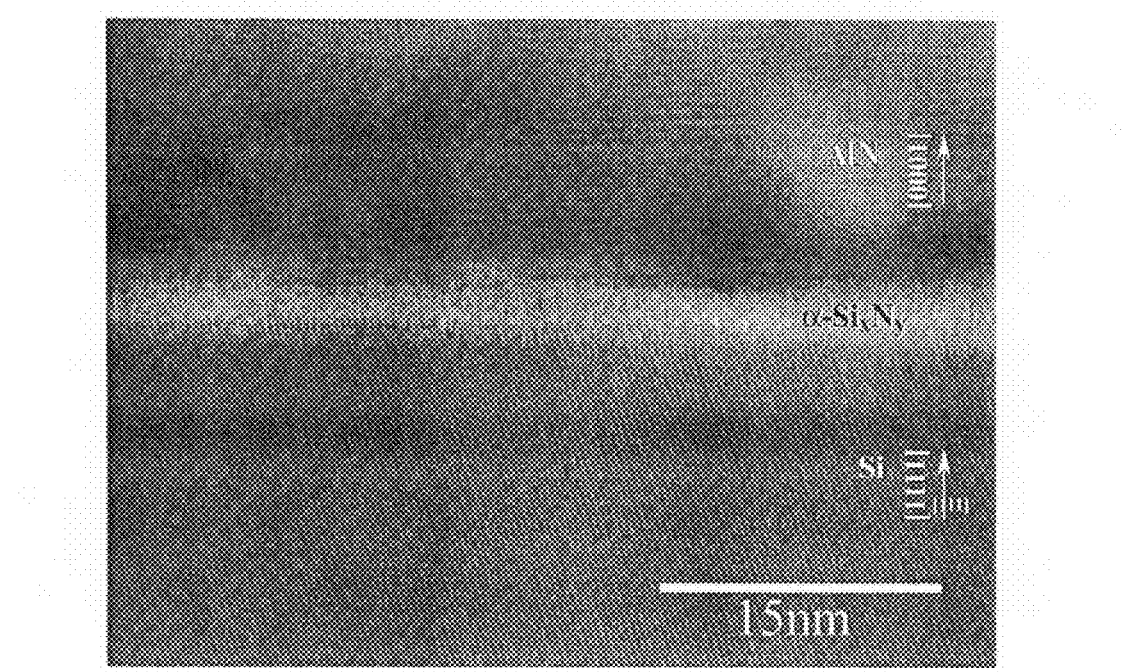
FIGS. 6 and 7 are copies of high-resolution TEM images that illustrates the presence of a silicon nitride strain-absorbing layer between an aluminum nitride layer and a silicon substrate as described in Example 1.
Figure 7:
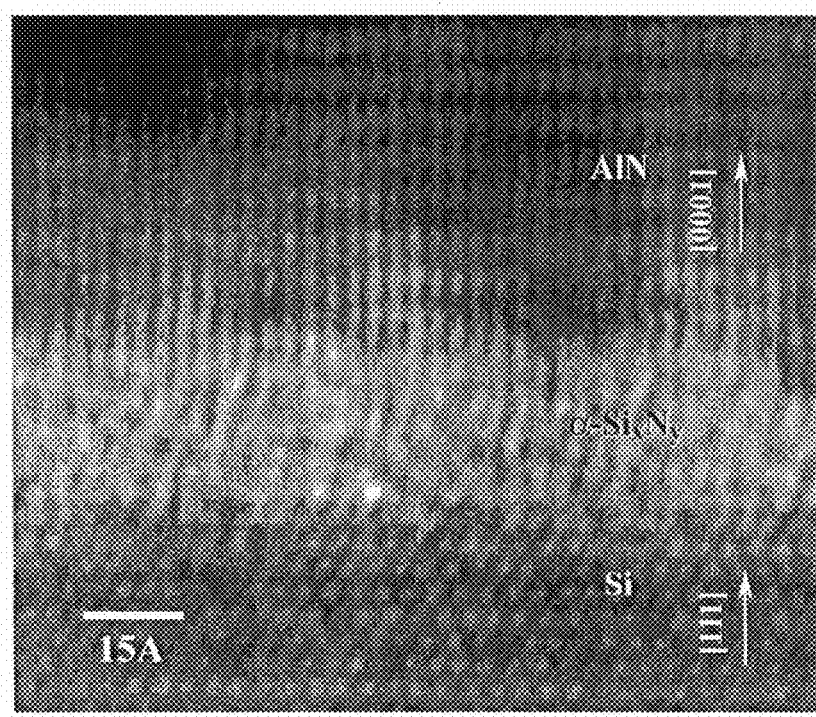

FIGS. 5-7 are copies of micrograph images that illustrate the resulting structure. FIG. 5 is a copy of a STEM (scanning transmission electron microscope) image. FIGS. 6 and 7 are copies of high-resolution TEM images. The images show the presence of an amorphous silicon nitride strain-absorbing layer formed between a single crystal aluminum nitride layer and a single crystal silicon substrate. In particular, the high-resolution TEM images show the crystal structures of the resulting layers and substrate. The images show that the crystal structure of the silicon nitride layer is amorphous, the crystal structure of the silicon substrate is cubic and the crystal structure of the aluminum nitride is hexagonal. The aluminum nitride layer has an epitaxial relationship with the substrate.

The images also show the absence of misfit dislocations at (or near) the interface of the amorphous silicon nitride strain-absorbing layer and the aluminum nitride layer.

This example establishes that strain-absorbing layers of the present invention may be used to limit misfit dislocation density.

Comparative Example

This example illustrates the presence of misfit dislocations in an aluminum nitride layer formed directly on a silicon substrate in the absence of a strain-absorbing layer of the present invention.

Figure 8:
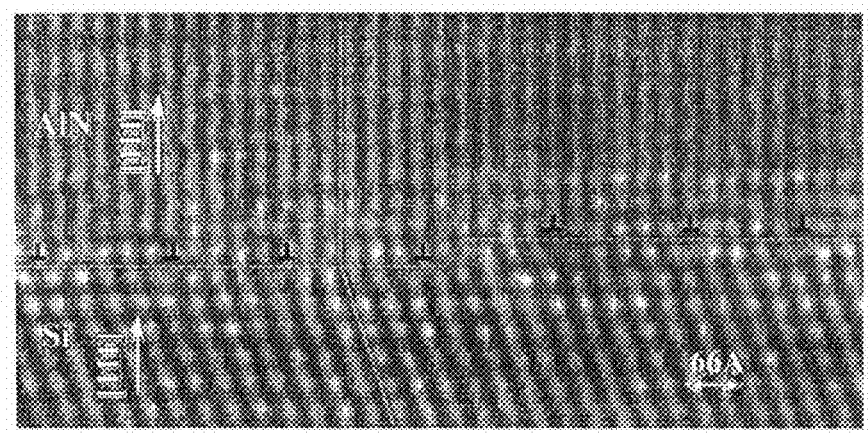
FIG. 8 is a copy of an image published in R. Liu, et. al., Applied Phys. Lett. 83(5), 860 (2003) that illustrates an aluminum nitride layer and silicon substrate interface without the presence of a silicon nitride strain-absorbing layer as described in the Comparative Example.

FIG. 8 is a copy of an image published in R. Liu, et. al., Applied Phys. Lett. 83(5), 860 (2003). The image illustrates an aluminum nitride layer formed directly on a silicon substrate, without the presence of a silicon nitride strain-absorbing layer, following procedures described in the article. Misfit dislocations are indicated by "⊥". The interface coherence is indicated by solid lines that connect $\{111\}_{Si}$ and $\{1\text{-}100\}_{AlN}$ lattice planes.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A semiconductor structure comprising:
   a semiconductor material region;
   a strain-absorbing layer wherein the entire strain-absorbing layer overlies the entire semiconductor material region, and wherein the entire strain-absorbing layer comprises a silicon nitride-based material and has an amorphous structure; and
   a nitride-based material layer formed directly on the entire strain-absorbing layer, wherein the misfit dislocation density in the nitride-based material layer is less than about $10^{10}$ defects/cm$^2$.

2. The structure of claim 1, wherein the semiconductor material region is a substrate.

3. The structure of claim 2, wherein the substrate is substantially planar.

4. The structure of claim 2, wherein the substrate is silicon.

5. The structure of claim 2, wherein the substrate is silicon carbide.

6. The structure of claim 1, wherein the misfit dislocation density is less than about $10^8$ defects/cm$^2$.

7. The structure of claim 1, wherein the misfit dislocation density is less than about $10^5$ defects/cm$^2$.

8. The structure of claim 1, wherein the misfit dislocation density is less than about $10^2$ defects/cm$^2$.

9. The structure of claim 1, wherein the nitride-based material layer comprises an aluminum nitride-based material.

10. The structure of claim 1, wherein the nitride-based material layer comprises a gallium nitride material.

11. The structure of claim 1, wherein the nitride-based material layer is compositionally-graded.

12. The structure of claim 1, further comprising a gallium nitride material region formed over the nitride-based material layer.

13. The structure of claim 12, further comprising a compositionally-graded transition layer formed between the gallium nitride material region and the nitride-based material layer.

14. The structure of claim 12, further comprising a source electrode, a gate electrode and a drain electrode formed on the gallium nitride material region.

15. The structure of claim 1, wherein the substrate has a thickness of greater than about 125 micron.

16. The structure of claim 1, wherein the strain-absorbing layer is substantially planar.

17. The structure of claim 1, wherein the semiconductor material region is an underlying layer.

18. The structure of claim 1, wherein the semiconductor material region comprises a gallium nitride material.

19. The structure of claim 1, wherein the semiconductor material region comprises an aluminum nitride-based material.

20. The structure of claim 1, wherein the semiconductor material region comprises a different material than the nitride-based material layer.

21. The structure of claim 1, wherein the semiconductor material region has a different crystal structure than the nitride-based material layer.

22. The structure of claim 1, wherein the nitride-based material layer is single-crystalline.

23. The structure of claim 1, wherein the entire top surface of the strain-absorbing layer comprises SiN.

24. A semiconductor structure comprising:
a semiconductor material region;
a strain-absorbing layer wherein the entire strain-absorbing layer overlies the entire semiconductor material region, and wherein the entire strain-absorbing layer comprises a silicon nitride-based material and has a thickness of less than 100 Angstroms; and
a nitide-based material layer formed directly on the entire strain-absorbing layers, wherein the misfit dislocation density in the nitride-based material layer is less than about $10^{10}$ defects/cm$^2$.

25. The structure of claim 24, wherein the silicon nitride-based material has an amorphous structure.

26. The structure of claim 24, wherein the strain-absorbing layer has a thickness of greater than 10 Angstroms.

27. The structure of claim 24, further comprising a gallium nitride material region formed over the nitride-based material layer.

28. The structure of claim 27, further comprising a source electrode, a gate electrode and a drain electrode formed on the gallium nitride material region.

29. The structure of claim 24, wherein the entire top surface of the strain-absorbing layer comprises $Si_XN_Y$.

* * * * *

UNITED STATES PATENT AND TRADEMARK OFFICE
CERTIFICATE OF CORRECTION

| | |
|---|---|
| PATENT NO. | : 7,339,205 B2 |
| APPLICATION NO. | : 10/879703 |
| DATED | : March 4, 2008 |
| INVENTOR(S) | : Edwin Lanier Piner et al. |

It is certified that error appears in the above-identified patent and that said Letters Patent is hereby corrected as shown below:

Column 16:

Claim 24, line 1, "nitide-based" should read --nitride-based--; and

Claim 24, line 2, the word "layers" should read --layer--.

Signed and Sealed this

Seventeenth Day of June, 2008

JON W. DUDAS
*Director of the United States Patent and Trademark Office*

UNITED STATES PATENT AND TRADEMARK OFFICE
CERTIFICATE OF CORRECTION

PATENT NO. : 7,339,205 B2  Page 1 of 1
APPLICATION NO. : 10/879703
DATED : March 4, 2008
INVENTOR(S) : Edwin Lanier Piner et al.

It is certified that error appears in the above-identified patent and that said Letters Patent is hereby corrected as shown below:

Column 15, Claim 24, line 14, "nitide-based" should read --nitride-based--; and

Column 15, Claim 24, line 15, the word "layers" should read --layer--.

This certificate supersedes the Certificate of Correction issued June 17, 2008.

Signed and Sealed this

Fifth Day of August, 2008

JON W. DUDAS
*Director of the United States Patent and Trademark Office*